United States Patent
Paviet-Salomon et al.

(10) Patent No.: US 11,251,325 B2
(45) Date of Patent: Feb. 15, 2022

(54) PHOTOVOLTAIC DEVICE AND METHOD FOR MANUFACTURING THE SAME

(71) Applicant: CSEM CENTRE SUISSE D'ELECTRONIQUE ET DE MICROTECHNIQUE SA—RECHERCHE ET DEVELOPPEMENT, Neuchâtel (CH)

(72) Inventors: Bertrand Paviet-Salomon, Neuchâtel (CH); Andrea Tomasi, Neuchâtel (CH); Matthieu Despeisse, Neuchâtel (CH); Christophe Ballif, Neuchâtel (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 0 days.

(21) Appl. No.: 15/769,303

(22) PCT Filed: Nov. 1, 2016

(86) PCT No.: PCT/EP2016/076301
§ 371 (c)(1),
(2) Date: Apr. 18, 2018

(87) PCT Pub. No.: WO2017/076832
PCT Pub. Date: May 11, 2017

(65) Prior Publication Data
US 2018/0309010 A1    Oct. 25, 2018

(30) Foreign Application Priority Data

Nov. 2, 2015   (EP) .................................... 15192655

(51) Int. Cl.
*H01L 31/0747* (2012.01)
*H01L 31/0745* (2012.01)
(Continued)

(52) U.S. Cl.
CPC ...... *H01L 31/0747* (2013.01); *H01L 31/0745* (2013.01); *H01L 31/1804* (2013.01);
(Continued)

(58) Field of Classification Search
CPC . H01L 31/074–0749; H01L 31/022441; H01L 31/022458; H01L 31/1804; H01L 31/202; Y02E 10/547
See application file for complete search history.

(56) References Cited

U.S. PATENT DOCUMENTS

2006/0130891 A1*  6/2006  Carlson ............. H01L 31/02168
                                                    136/256
2007/0169808 A1   7/2007  Kherani et al.
(Continued)

FOREIGN PATENT DOCUMENTS

CN    102931269 A    2/2013
CN    103035779 A    4/2013
(Continued)

OTHER PUBLICATIONS

Strahm et al., (Plasma silane concentration as a determining factor for the transition from amorphous to microcrystalline silicon in SiH4/H2 discharges), 2006.*
(Continued)

*Primary Examiner* — Niki Bakhtiari
(74) *Attorney, Agent, or Firm* — Christensen O'Connor Johnson Kindness PLLC

(57) ABSTRACT

A photovoltaic device is proposed comprising a silicon-based substrate (2) having a p-type or n-type doping, with an intrinsic buffer layer (4) situated on said substrate. A first
(Continued)

silicon layer (6) of a first doping type is situated on predetermined regions (4a) of the intrinsic buffer layer. The first layer has interstices (5) between said predetermined regions (4a). The first silicon layer comprises at least partially a microcrystalline layer at its side away from the substrate. A microcrystalline silicon layer (8) of a second doping type is situated on said first silicon layer (6). A third silicon layer (10) of the second doping type is situated on said intrinsic buffer layer at the interstices, the third silicon layer being amorphous at its side facing said silicon-based substrate and comprising an at least partially microcrystalline layer portion to the side away from the intrinsic buffer layer.

18 Claims, 4 Drawing Sheets

(51) Int. Cl.
  *H01L 31/18* (2006.01)
  *H01L 31/20* (2006.01)
(52) U.S. Cl.
  CPC .......... *H01L 31/202* (2013.01); *Y02E 10/547* (2013.01); *Y02P 70/50* (2015.11)

(56) References Cited

U.S. PATENT DOCUMENTS

| | | |
|---|---|---|
| 2011/0259408 A1 | 10/2011 | Ramappa et al. |
| 2012/0042945 A1* | 2/2012 | Ji ........................ H01L 31/0747 136/256 |
| 2013/0288423 A1* | 10/2013 | Takahama ....... H01L 31/022441 438/96 |
| 2014/0015087 A1 | 1/2014 | Jung et al. |
| 2014/0227825 A1 | 8/2014 | Chen et al. |

FOREIGN PATENT DOCUMENTS

| | | |
|---|---|---|
| EP | 1 519 422 A2 | 3/2005 |
| JP | 2005101151 A | 4/2005 |
| JP | 2014135343 A | 7/2014 |
| WO | 2010113750 A1 | 10/2010 |
| WO | 2014016931 A1 | 1/2014 |

OTHER PUBLICATIONS

International Search Report dated Jan. 17, 2017, issued in corresponding International Application No. PCT/EP2016/076301, filed Nov. 1, 2016, 3 pages.

Lu, M. et al.: "A—Si/C—Si Heterojunction for Interdigitated Back Contact Solar Cell," The Compiled State-of-the-Art of PV Solar Technology and Deployment: 22nd European Photovoltaic Solar Energy Conference, EU PVSEC; Proceedings of the International Conference, held in Milan, Italy, Sep. 3-7, 2007, Munich: WIP-Renewable Energy, Sep. 3, 2007, pp. 924-927.

Tomasi, A. et al.: "Back-Contacted Silicon Heterojunction Solar Cells With Efficiency >21%," IEEE Journal of Photovoltaics 4 (4): 1046-1054, Jul. 2014.

Office Action dated Nov. 6, 2020, issued in corresponding Japanese Application No. JP2018519966, filed Jul. 20, 2016, 6 pages.

Third Office Action dated Nov. 15, 2021, issued in corresponding Application No. CN 201680060894.0, 12 pages.

* cited by examiner

PHOTOVOLTAIC DEVICE AND METHOD FOR MANUFACTURING THE SAME

TECHNICAL FIELD

The present invention relates to the field of photovoltaic devices. More particularly, it relates to a photovoltaic device with back-contacts, in which the collecting material is patterned, resulting in a device with a tunnel junction. The invention also relates to a method for producing this photovoltaic device.

A particular advantageous application of the present invention is for the production of photovoltaic cells intended for generating electrical energy, but the invention also applies, more generally, to any structure in which an incoming radiation is converted into an electrical signal, such as photodetectors and ionizing radiation detectors.

BACKGROUND OF THE INVENTION

Interdigitated back-contact silicon heterojunction solar cells (IBC-SHJ) currently hold the world-record efficiency for crystalline silicon solar cells. See: *Achievement of more than 25% conversion efficiency with crystalline silicon heterojunction solar cell*, K. Masuko et al., IEEE J. Photovoltaics, vol. 4, nr. 6, pp. 1433-1435, 2014. However, the successful spread of IBC-SHJ devices is hindered by their highly complex processing. Indeed, the realization of IBC-SHJ devices requires patterning the rear a-Si:H layers and TCO/metal stacks into interdigitated combs, with an accuracy of ~10 µm. Most of the techniques known from the state-of-the-art rely on the extensive use of photolithography and wet-etching steps, which result in a complex and costly process, see for example:

*Development of Heterojunction Back Contact Si Solar Cells*, J. Nakamura et al., IEEE J. Photovoltaics, vol. 4, nr. 6, pp. 1433-1435, 2014;

*Efficient interdigitated back-contacted silicon heterojunction solar cells*, N. Mingirulli et al, Phys. status solidi-Rapid Res. Lett., vol. 5, nr. 4, pp. 159-161, April 2011;

*The role of back contact patterning on stability and performance of Si IBC heterojunction solar cells*, U. K. DAS et al., Proceedings of the 40 the IEEE Photovoltaic Specialist Conference, 2014, vol. 1;

*Heterojunction Interdigitated Back-contact Solar cells Fabricated on Wafer Bonded to Glass*, S. N. Granata et al., IEEE J. Photovoltaics, pp. 1-7, 2014.

In another example, the document WO 03/083955 describes a device requiring two patterning steps needing an insulating layer between the charge carrier collecting structures also defined as fingers. One of the charge collecting structures is of the n-doped type or the p-doped type and the other charge carrier collecting structure, is of the other doped type. The device described in WO 03/083955 is not cost effective because of the extensive use of photolithography.

Document WO 2006/077343 describes another device requiring two patterning steps, but it needs an insulating layer between the n- and p-fingers which makes the process complex. Alternatively, laser ablation can be used, see *Laser assisted patterning of hydrogenated amorphous silicon for interdigitated back contact silicon heterojunction solar cell*, S.-De Vecchi et al, Proc. SPIE, vol. 8473, p. 84730R-1, October 2012. However, in this technique, to prevent severe damages to the a-Si:H layers, due to the absorption of the laser radiation, buffer layers must be deposited on top of them, which makes this process very complex.

In still another document US 2014/03723919, two patterning steps are used, and a buffer layer to insulate the n- and the p-type charge collecting structures is required. This buffer layer is afterwards laser-patterned, therefore damages to the a-Si:H layers are difficult to avoid, leading to a device with limited lifetime.

Regardless of the chosen patterning technique, all the afore-mentioned approaches require to pattern both the electron- and the hole-collecting structures. FIG. 1 shows a typical design of a prior art IBC-SHJ solar cell in which both the n-type and the p-type a-Si:H layers 6, 7 are patterned. This makes the realization of all of the IBC-SHJ devices lengthy, delicate, and thus strongly cost-ineffective.

To tackle this issue, some other alternatives propose to pattern only a first silicon layer 6 which is an n-doped layer or a p-doped layer, i.e. an electron- or a hole-collecting structure. A second silicon layer 9 of a second type is, in these alternative devices, fully deposited on top of the patterned charge-collecting structures 6, as illustrated in FIG. 2. Said second silicon layer 9 is of the opposite type as the type of the first silicon layer 6, i.e. if the first silicon layer 6 is of the n-doped type, said second silicon layer 9 is of the p-doped type and vice-versa. The resulting device, illustrated in FIG. 2, is called a "tunnel IBC-SHJ device". In an exemplary realization of the device of prior art illustrated in FIG. 2, the first type of the charge collecting structure is an n-type a-Si:H finger, and only this n-type a-Si:H is patterned. In said exemplary realization of the device of FIG. 2, a p-type a-Si:H layer covers both the intrinsic a-Si:H buffer layer 4 as well as the patterned n-type a-Si:H fingers, i.e. said first silicon layer 6. As one patterning step is saved in the prior art device of FIG. 2, such a process flow results in a simpler and thus cost-effective process. In addition, said second silicon layer 9 generates a self-aligned collecting structure, which is of the opposite doped type with respect to the doped type of said first silicon layer 6. The types of devices illustrated in FIG. 2 have reduced efficiencies compared to devices illustrated in FIG. 1 in which both of the charge carrier collecting finger types are structured. For example, in the document EP 1519422, there are FF and Voc losses compared to devices in which the two charge carrier collecting finger types are patterned. This is due to the fact that the tunnel layer used in EP 1519422 is homogeneous and has the same properties when situated on the intrinsic buffer layer 4 and on the patterned hole-collecting fingers.

SUMMARY OF THE INVENTION

The present invention relates to a photovoltaic device which allows to alleviate the disadvantages of the prior art. Accordingly the present invention relates to a photovoltaic device comprising:
- a silicon-based substrate having a p-type or n-type doping and having a first face;
- a passivating layer situated on said first face, preferably an intrinsic buffer layer;
- a first silicon layer situated on said intrinsic buffer layer, said first silicon layer having a doping of a first type being one of p-type doping or n-type doping, said first silicon layer being a patterned layer situated on predetermined regions of said intrinsic buffer layer and having interstices between said predefined regions. The first silicon layer comprising an at least partially microcrystalline layer at its side away from said silicon-based substrate;
- a second, microcrystalline, silicon layer situated on said first silicon layer, said second silicon layer having a doping of a second type being the other of the p-type doping or the n-type doping with respect to said doping of said first silicon layer.

The photovoltaic device further comprises:
a third silicon layer situated on said intrinsic buffer layer in said interstices, said third silicon layer being amorphous at least at its side facing said silicon-based substrate and having a doping of said second type, said third silicon layer comprising an at least partially microcrystalline layer portion to the side away from said intrinsic buffer layer;
electrically conducting pads situated on said second silicon layer and on said third silicon layer.

The second silicon layer and the third silicon layer constitute a single layer, defined as tunnel layer, with the doping and the thickness of said tunnel layer being chosen so that the second silicon layer does not impede the charge collecting operation of the photovoltaic device.

In an embodiment the first silicon layer is entirely microcrystalline.

In an embodiment said first and/or third silicon layers are microcrystalline at their side away from said silicon-based substrate. This allows assuring a good contact with said second silicon layer and with said electrically conducting pads.

In an embodiment, said third layer is amorphous to a distance of between 1 and 5 nm from its side facing said silicon-based substrate. This amorphous portion allows maintaining a good passivation at the interface with said intrinsic buffer layer.

In an embodiment, said first layer is amorphous to a distance of between 1 and 5 nm from its side facing said silicon-based substrate. This amorphous portion allows maintaining a good passivation at the interface with said intrinsic buffer layer.

In an embodiment said first layer is microcrystalline to a distance of between 1 and 5 nm from its side away from said silicon-based substrate.

In an embodiment said third layer is microcrystalline to a distance of between 1 and 5 nm from its side away from said silicon-based substrate.

In different embodiments,
said silicon-based substrate is n-type doped and said first type doping is n-type; or
said silicon-based substrate is n-type doped and said first type doping is p-type; or
said silicon-based substrate is p-type doped and said first type doping is n-type; or
said silicon-based substrate is p-type doped and said first type doping is p-type.

In an embodiment said silicon-based substrate is monocrystalline and/or said second silicon layer is microcrystalline.

In an embodiment a metal oxide layer may be situated between said electrically-conducting pads and at least one of said second silicon layer and said third silicon layer. Such a metal oxide layer may provide an improvement of the charge carrier selective contact.

The invention relates also to a method for manufacturing a photovoltaic device comprising the steps of:
a) providing a silicon-based substrate having a first face, said silicon-based substrate having a p-type or n-type doping;
b) depositing an intrinsic buffer layer on said first face;
c) depositing a patterned first silicon layer on predetermined regions of said intrinsic buffer layer thereby leaving interstices between said predefined regions, said first silicon layer having a doping of a first type being one of p-type or n-type, said first silicon layer 6 comprising an at least partially crystalline layer at its side away from said silicon-based substrate 2;
d) simultaneously depositing a microcrystalline silicon layer, also defined as tunnel layer, which form said second silicon layer on said first silicon layer and said third silicon layer on said intrinsic buffer layer at said interstices, said second silicon layer having a doping of a second type being the other of p-type or n-type with respect to the doping of said first silicon layer, and said third silicon layer being amorphous at least at its side facing said silicon-based substrate and being at least partially microcrystalline at its side away from said silicon-based substrate and having a doping of said second type, said second silicon layer and said third silicon layer constituting a single layer, defined as tunnel layer, with the doping and the thickness of said tunnel layer being chosen so that the second silicon layer does not impede the charge collecting operation of the photovoltaic device.
e) depositing electrically conducting pads on said second layer and said third layer.

In an embodiment of the method, said second silicon layer is a microcrystalline type silicon layer and said intrinsic buffer layer is amorphous.

In an embodiment of the method said first layer is deposited so as to be amorphous to a distance of between 1 nm and 5 nm from its side facing said silicon-based substrate.

In an embodiment of the method said third layer is deposited so as to be amorphous to a distance of between 1 nm and 5 nm from its side facing said silicon-based substrate.

In an embodiment of said method, said first and/or third layer is deposited such that it is microcrystalline at its side away from said silicon-based substrate.

In an embodiment of the method said first and/or third layer is deposited so as to be microcrystalline to a distance of between 1 nm and 5 nm from their side away from said silicon-based substrate.

In an embodiment the method comprises further the following step between said step d) and said step e):
d1) depositing a metal oxide layer on at least one of said second silicon layer and said third silicon layer.

BRIEF DESCRIPTION OF THE DRAWINGS

The present invention will now be described in reference to the enclosed drawings where.

DETAILED DESCRIPTION

Figure 1:
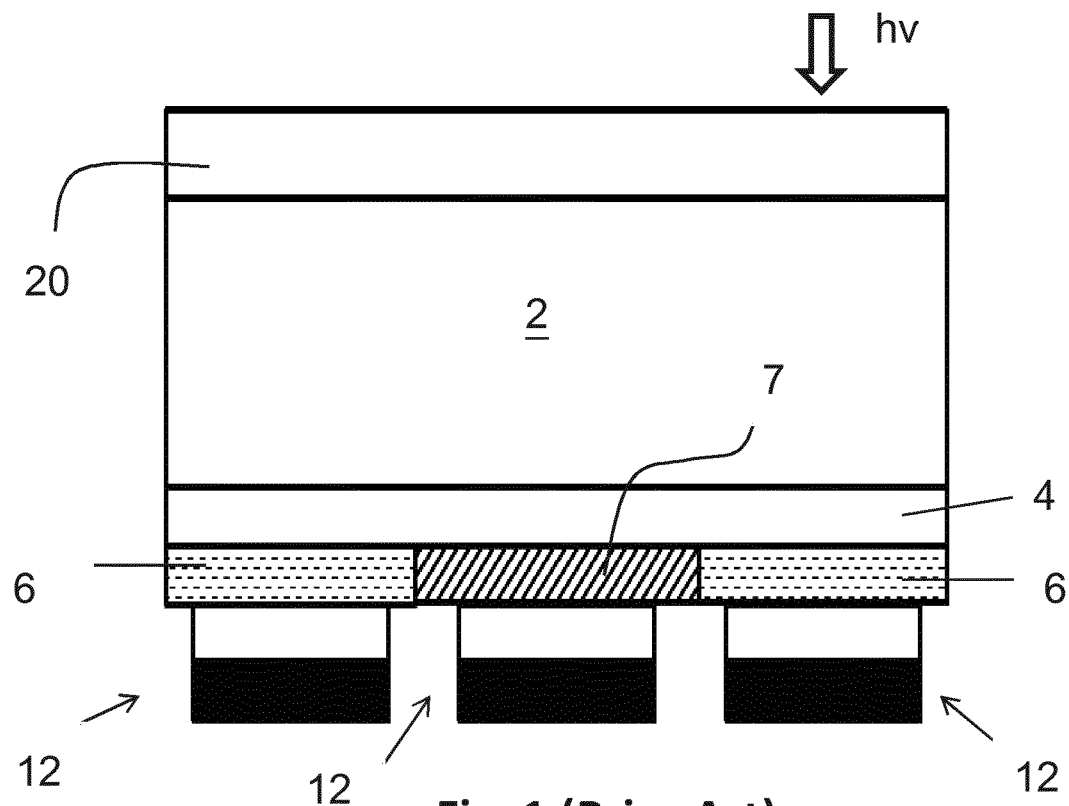
FIG. 1 is a schematic cross-section view of a photovoltaic IBC-SHJ cell of prior art in which both the n- and p-type a-Si:H layers are patterned.
Figure 2:
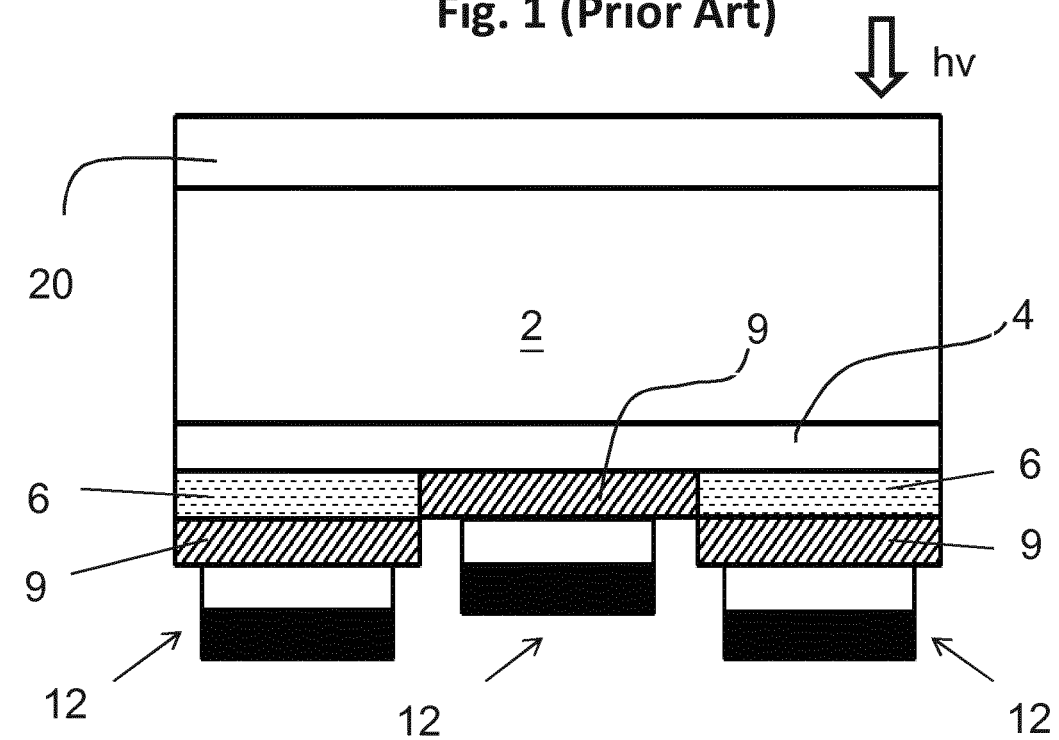
FIG. 2 is a schematic cross-section view of a prior art tunnel IBC-SHJ photovoltaic device in which only one of n-type or p-type a-Si:H charge collecting structures are patterned and in which an a-Si:H layer of the other type covers both the intrinsic a-Si:H buffer layer and a patterned a-Si:H charge collecting structure.
Figure 3:
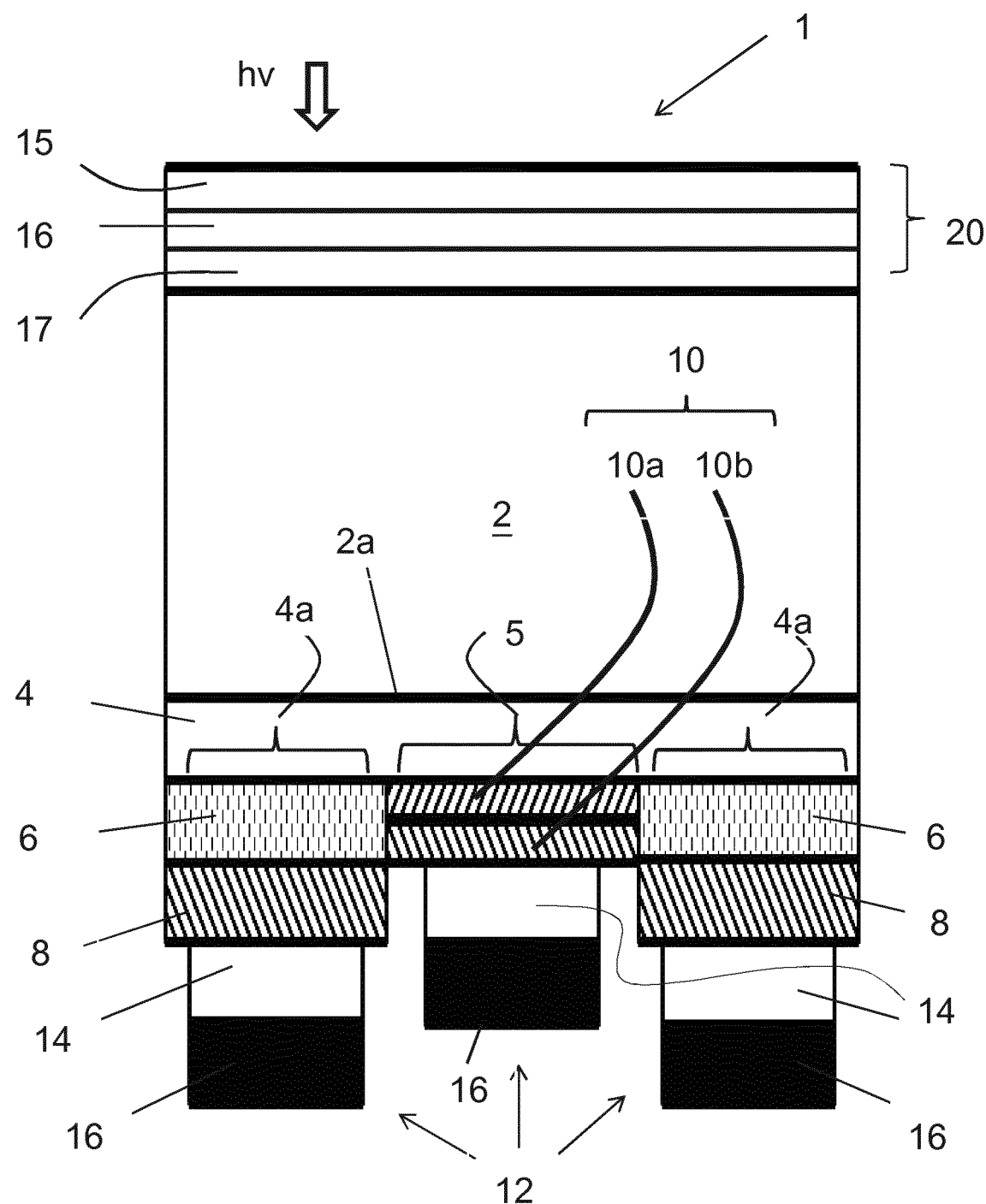
FIG. 3 is a schematic cross-section view of a photovoltaic device of the invention, comprising a first silicon layer situated on predetermined regions of an intrinsic buffer layer, a second layer situated on the first silicon layer and a third silicon layer situated in the interstices between said predetermined regions.

FIG. 3 shows the basic configuration of the layers of the photovoltaic device 1 according to the invention.

The photovoltaic device 1 comprises a silicon-based substrate 2 which may have an n-type doping or a p-type doping. The silicon based substrate 2 has a first face 2a situated to the opposite side of the incoming light (hv in FIG. 3). On said first face 2a an intrinsic buffer layer 4 is situated. This intrinsic buffer layer 4 is an amorphous layer. The role of this intrinsic buffer layer 4 is to reduce the recombination rate of carriers at the rear surface of said silicon-based substrate 2.

Figure 4A:
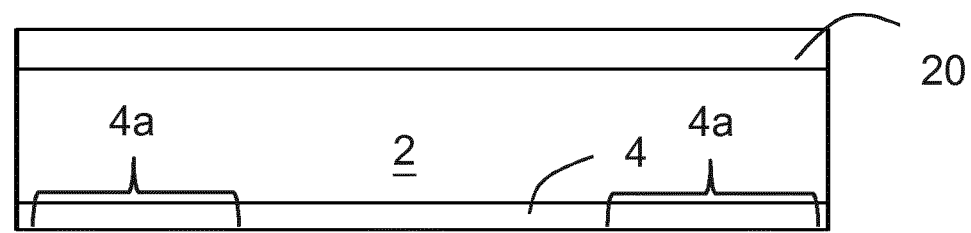
FIG. 4a-d illustrates the process flow of the fabrication process of the photovoltaic device, according to the invention.
Figure 4B:
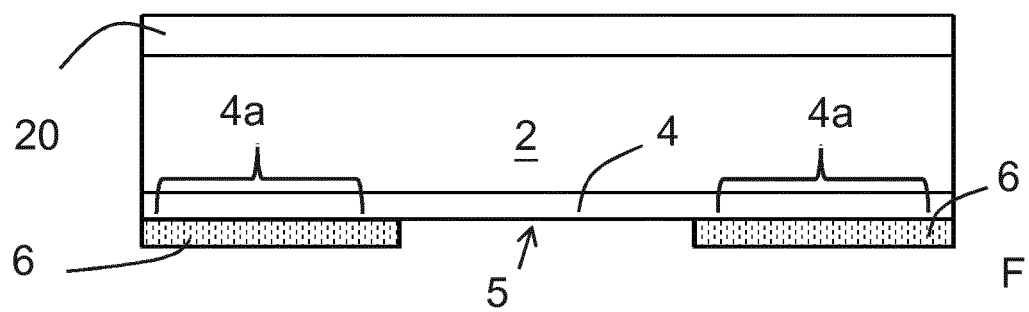

On said intrinsic buffer layer 4 a first silicon layer 6 is situated to the opposite side of the incoming light. Said first silicon layer 6 is a silicon layer having a doping of a first type which may be a p-type doping or an n-type doping. The role of said first silicon layer 6 is to collect electrons when it is of the n-type and to collect holes when it is of the p-type. Said first silicon layer 6 is a patterned layer situated on predetermined regions 4a of the intrinsic buffer layer 4, as illustrated in FIG. 4a and FIG. 4b. Otherwise said, the first silicon layer 6 forms a plurality of regions, also defined as islands, of p-type doped or n-type doped silicon, situated on the intrinsic buffer layer 4. Said islands are also defined as charge-collecting structures, or also defined as fingers. Said first silicon layer 6 is preferably made out of n-type amorphous silicon (a-Si:H) or proto-crystalline silicon (pc-Si:H) or nano-crystalline silicon (nc-Si:H) or micro-crystalline silicon (μc-Si:H) or any combination or stack of these layers or any alloys made using these layers (such as oxygen or carbon alloying).

In an embodiment the first silicon layer 6 comprises an at least partially microcrystalline layer at its side away from said silicon-based substrate 2 so as to assure a good contact with the second silicon layer 8 and the electrically conducting pads 12 which are further described. In an embodiment the first silicon layer 6 is entirely a microcrystalline layer.

The wording microcrystalline is defined by the Raman crystallinity of the concerned layer. The Raman crystallinity ($\chi_c$) of a silicon layer is defined as follow (see e.g. C. Droz et al.: Relationship between Raman crystallinity and open-circuit voltage in micro-crystalline silicon solar cells, Solar Energy Materials & Solar Cells 81 (1), 61-71, 2004):

$$\chi_c = (A_{510} + A_{520})/(A_{480} + A_{510} + A_{520})$$

where $A_{480}$, $A_{510}$ and $A_{520}$ denotes the area below the Gaussian peak at 480 cm$^{-1}$ (resp. 510 cm$^{-1}$ and 520 cm$^{-1}$).

In the present document, a microcrystalline silicon layer is hence defined as a silicon layer whose Raman crystallinity is higher than 5%. Conversely, an amorphous silicon layer is defined as a layer with $\chi_c < 5\%$.

Between said predetermined regions 4a are located interstices 5 which are free of said first silicon layer material. In these interstices 5, a third silicon layer 10 is situated to the side opposite to the incident light side, as further described in detail.

It has been remarked that when trying to deposit a microcrystalline layer on an amorphous intrinsic buffer layer 4 this microcrystalline layer presents a crystalline modification in the first nm from that intrinsic buffer layer 4 that leads to a thin amorphous portion 10a. This crystalline modification depends on the deposition parameters. In particular, said third silicon layer 10, facing said intrinsic buffer layer 4, is amorphous to the side of said intrinsic buffer layer 4 and comprises preferably a microcrystalline portion 10b to the side away from said intrinsic buffer layer 4, as described in more detail further. The amorphous nature of the third silicon layer 10 to the side of said intrinsic buffer layer 4 allows reducing the carrier recombination rate at the interface between said third silicon layer 10 and said intrinsic buffer layer 4. Said microcrystalline portion 10b of said third silicon layer 10 allows at least to improve the contact with electrical conducting pads, and so the charge collection efficiency.

Figure 4C:
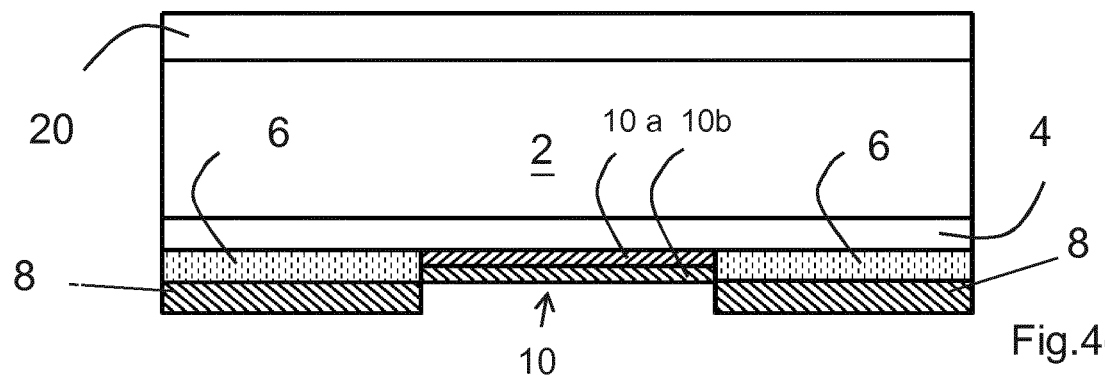

A second microcrystalline silicon layer 8 is situated on said first silicon layer 6 to the side opposite to said intrinsic buffer layer 4, as shown in FIG. 3 and FIG. 4c. Said second silicon layer 8 has a doping of a second type being the other of the p-type doping or the n-type doping with respect to said first type doping of said first silicon layer 6. For example if the first silicon layer 6 has a p-type doping, the second silicon layer 8 has an n-type doping and vice versa.

In all embodiments of the invention said first silicon layer 6 and said third silicon layer 10 are both microcrystalline at their side away from said silicon-based substrate 2. This ensures a good contact with respectively said second silicon layer 8 and said electrically conducting pads 12.

In an embodiment said first silicon layer 6 is entirely microcrystalline. Entirely is defined as being over the entire volume of the layer.

In an embodiment said first silicon layer 6 and said third silicon layer 10 are both amorphous to their side facing said silicon substrate 2, allowing to maintain a good passivation at the interface with said intrinsic buffer layer 4. The thickness, defined perpendicular to the plane of the silicon layers, of the amorphous portion of said first silicon layer 6 and said third silicon layer 10 may be different.

In an embodiment, said third layer 10 is amorphous to a distance of between 1 nm and 5 nm from its side facing said silicon-based substrate 2. Other distances are possible as well, such as a distance of 10 nm or a distance of 20 nm.

In another embodiment, said third silicon layer 10 is microcrystalline to a distance of between 1 nm and 5 nm from its side away from said silicon based substrate. Other distances are possible as well such as a distance of 10 nm or a distance of 20 nm.

As further described in the essential step of the manufacturing method of the invention, said second silicon layer 8 and said third silicon layer 10 are realized in a single process step. By realizing said second silicon layer 8 and said third silicon layer 10 in a single process step, said second silicon layer 8 and said third silicon layer 10 constitute a single layer, defined as the tunnel layer, whose properties are different when present on said intrinsic buffer layer 4 or on said first silicon layer 6, for the reasons described before.

Figure 4D:
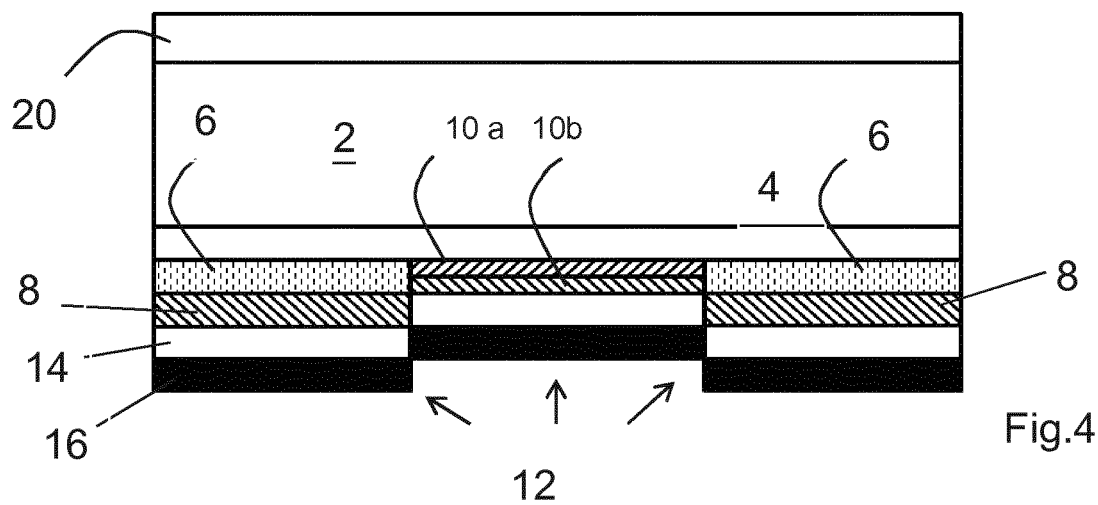

Said single tunnel layer ensures a good contact with electrically-conducting pads, preferably TCO/metal conducting pads as illustrated in FIG. 3 and FIG. 4d.

Otherwise said, the tunnel layer comprises a first portion and a second portion: a first portion, i.e. said second silicon layer 8, situated on said first silicon layer 6, and a second portion, i.e. said third silicon layer 10, situated on said intrinsic buffer layer 4, comprising an amorphous layer portion 10a to the side of said intrinsic buffer layer 4, and a microcrystalline layer portion 10b to the side away from said intrinsic buffer layer 4. The fact that said second silicon layer 8 covers said first silicon layer 6 does not impede the charge collecting operation of the device provided that the doping and the thickness of the tunnel layer is carefully chosen. A detailed example is described further.

To summarize, the portion of said tunnel layer which is situated on said interstices 5, i.e. said third silicon layer 10, has unique properties which cannot be achieved by IBC-SHJ photovoltaic devices of prior art. Indeed, the amorphous portion of said tunnel layer ensures a good passivation to the intrinsic buffer layer 4 and on the other hand, the microcrystalline nature of said tunnel layer, to the side away from said intrinsic buffer layer 4, ensures a good contact to the electrically conducting pads 12, and ensures also substantially similar and elevated charge collection efficiencies of the two types of charge collecting structures, i.e. said first silicon layer 6 and said third silicon layer 10.

The different properties of said first and said second portion of the tunnel layer, depend on whether said first and second portion is situated on said intrinsic buffer layer 4 or on said first silicon layer 6, and are achieved by the fabrication method which is described further. Said tunnel layer is an important aspect of the present invention and alleviates most of the limitations of IBC-SHJ photovoltaic devices of prior art because it allows to realize electron and hole collecting structures in a single process step, which makes the device very efficient and cost effective.

The different possible doping combinations of the silicon-based substrate 2, the first silicon layer 6, the second silicon layer 8 and the third silicon layer 10 are summarized in the table 1:

TABLE 1 four different doping combinations of the layers 2, 6, 8, 10.

|   | Si substrate 2 | First Si-layer 6 | Second Si-layer 8 | Third Si-layer 10 |
|---|---|---|---|---|
| 1: | n-type | n-type | p-type | p-type |
| 2: | n-type | p-type | n-type | n-type |
| 3: | p-type | n-type | p-type | p-type |
| 4: | p-type | p-type | n-type | n-type |

For example, a preferred embodiment (example 1 of table 1) of the photovoltaic device 1 (example 1 of table 1) comprises an n-type silicon based substrate 2, an n-type first silicon layer 6, a p-type second silicon layer 8 and a p-type third silicon layer 10. In this preferred embodiment, the tunnel layer, which comprises said second silicon layer 8 and said third silicon layer 10, constitutes a single p-type tunnel layer. More precisely, in this preferred embodiment, holes are collected by the p-type third silicon layer 10 and the electrons are collected by the n-type first silicon layer 6, and then tunnel to an electrode 12 through the p-type silicon layer 8. In this example the portion of the tunnel layer covering the n-type first silicon layer 8 is of the p-type, i.e. a p-type second silicon layer 8. This p-type second silicon layer 8 does not impede the electron collecting operation of the device, provided that the doping and the thickness of the p-type tunnel layer is correctly chosen, as electrons will tunnel through that portion of the tunnel layer corresponding to said p-type second silicon layer 8.

It should be clear that different variants of the crystallographic transition of the amorphous side to the microcrystalline side of said third silicon layer 10 are possible. This crystallographic transition may be a substantially linear transition or may be another transition such as an exponential transition, or a substantial step-like transition.

The thickness of said tunnel layer, i.e. the thickness of said second silicon layer 8 and said third silicon layer 10 is preferably between 1 nm and 200 nm, more preferably between 1 and 100 nm, even more preferably between 1 nm and 50 nm.

The Raman crystallinity of the portion 10b of said third silicon layer 10, is preferably between 5% and 100%, preferably between 10% and 80%, more preferably between 20% and 60%.

In the case the second silicon layer 6 is partially crystalline, its crystalline portion has a Raman crystallinity between 5% and 100%, preferably between 10% and 80%, more preferably between 20% and 60%.

In any embodiment the microcrystallinity of the second 6 and third layer 10 may be different.

In an embodiment a metal oxide layer may be situated between the silicon layers 8 and 10 and the electrodes 12. The metal oxide layer may be made of $MoO_x$, or $VaO_x$, or $HfO_x$ and acts as a carrier selective contact. Said metal oxide layer may be patterned with any method known from prior art.

It is generally understood that the photovoltaic device 1 of the invention may comprise several different layers situated to the incident light side of the silicon-based substrate 2. Typical layers, illustrated in FIG. 4, are a buffer layer 17, which may be different than said intrinsic buffer layer 4, a front layer 16 which is preferably an amorphous layer of the same type as the type of said silicon-based substrate 6, and an anti-reflection layer 15. It is understood that other layers than the ones described above may be situated in the photovoltaic device 1.

The invention is further achieved by a method of manufacturing of a photovoltaic device, illustrated in FIGS. 4 a-d, comprising the steps of:

a) providing a silicon-based substrate 2 having a first face 2a;

b) depositing an intrinsic buffer layer 4 on said first face 2a, as illustrated in FIG. 4a;

c) depositing, as illustrated in FIG. 4b, a patterned first silicon layer 6 on predetermined regions 4a of said intrinsic buffer layer 4, thereby leaving interstices 5 between said predetermined regions 4a, said first silicon layer 6 having a doping of a first type being one of p-type or n-type. Said first silicon layer 6 comprises an at least partially crystalline layer at its side away from said silicon-based substrate 2; The deposition of said patterned first silicon layer 6 may be performed by a technique described in WO 2008/0400273 incorporated here in its entirety;

d) as illustrated in FIG. 4c, simultaneously depositing a second silicon layer 8, which is entirely microcrystalline, on said first silicon layer 6 and a third silicon layer 10 on said intrinsic buffer layer 4 at said interstices 5, so that said second silicon layer 8 and said third silicon layer 10 form a single tunnel layer, said second silicon layer 8 having a doping of a second type being the other of p-type or n-type with respect to the doping of said first silicon layer 6, and said third silicon layer 10 being amorphous at its side facing said silicon-based substrate 2 and being at least partially microcrystalline at its side away from said silicon-based substrate 2 and having a doping of said second type, said second silicon layer 8 and said third silicon layer 10 constituting a single layer, defined as tunnel layer, with the doping and the thickness of said tunnel layer being chosen so that the second silicon layer 8 does not impede the charge collecting operation of the photovoltaic device;

e) depositing electrically conducting pads 12 on said second silicon layer 8 and said third silicon layer 10, as illustrated in FIG. 4d and FIG. 3. The electrically conducting pads comprise preferably a TCO layer 14 and a metal layer 16.

The advantage of the method of the invention is that said second silicon layer 8 and the portion of said third silicon layer 10, situated to the side away from said intrinsic buffer layer 4, are both micro-crystalline which improves considerably the device performances due to reduced transport losses. Another advantage of the method is that the contact of said second silicon layer 8 and said third silicon layer 10 with a TCO layer of the conducting pads 12 is improved and is less sensitive to process variations of the deposition of a standard TCO layer.

An important advantage of the method of the invention is that a fast and easily up-scalable process may be used to make BC-SHJ devices, as only one patterning step is required. In a preferred method, the single patterning step is performed to realize electron collecting structures, i.e. an n-type first silicon layer 6.

In a preferred embodiment of the method, said intrinsic buffer layer 4 is an amorphous layer.

In an embodiment of the method said third silicon layer 10 is deposited so as to be substantially amorphous to a distance of between 1 nm and 5 nm from its side facing said silicon-based substrate 2.

In another embodiment of the method said third silicon layer 10 is deposited so as to be microcrystalline to a distance of between 1 and 5 nm from its side away from said silicon-based substrate 2.

In an embodiment of the method said first silicon layer 6 is deposited so as to be amorphous to a distance of between 1 nm and 5 nm from its side facing said silicon-based substrate 2.

In another embodiment of the method said first silicon layer 6 is deposited so as to be microcrystalline to a distance of between 1 and 5 nm from its side away from said silicon-based substrate 2. In variants of the method, the deposited thickness of said first 6 and said third 10 silicon layer may be different. Also, the thickness of the crystalline portion of said first 6 and said third 10 silicon layer may be different in the case that said first silicon layer 6 is not entirely microcrystalline and comprises a microcrystalline layer to the side away from said intrinsic buffer layer (4).

It is generally understood that the lateral dimensions of said first, second and third silicon layers 6, 8, 10, defined in their planes, may be different.

In another embodiment of the method the following step is performed between said step d) and said step e):

d1) depositing a metal oxide layer on at least one of said second silicon layer 8 and said third silicon layer 10. Said metal oxide layer may be a $MoO_x$ layer, a $VaO_x$ layer or a $HfO_x$ layer but not necessarily so. The metal oxide layer acts as a carrier selective contact and may be patterned with any method known from prior art.

In order to complete the disclosure of the method of fabrication, the detailed fabrication process of a preferred embodiment comprising a n-type Si substrate 2, n-type first Si-layer 6, p-type second Si-layer 8, p-type third Si-layer 10, is described in more details here below:

The first, second and third silicon layers 6, 8, and 10 are deposited using a plasma-enhanced chemical vapor deposition (PECVD) reactor. For the n-type said first silicon layer 6, a gas mixture of $SiH_4$, $H_2$, and $PH_3$ is used. For the p-type said second silicon layer 8 and said third silicon layer 10, a gas mixture of $SiH_4$, $H_2$, and $B(CH_3)_3$ is used. Note that in both cases $D_2$ gas can also be added to increase the gas dilution. The preferred deposition temperature is 180° C. All first, second and third silicon layers 6, 8 and 10 can, preferably, comprise in their first nanometer deposition thickness an intrinsic "seed layer". This seed layer is a amorphous layer and helps controlling the transition to the micro-crystalline growth regime within said first, second and third silicon layers 6, 8, and 10. More precisely, the thicker said seed layer, the steeper the transition to the micro-crystalline regime will be in the first, second and third silicon layers 6, 8, and 10.

If no seed layer is used at all, then the deposited first, second and third silicon layers 6, 8 and 10 will be amorphous over most of their thickness; in contrast, if a thick seed layer is used, then said first, second and third silicon layers 6, 8 and 10 will be at least partially micro-crystalline over their whole thickness. In other words, the thickness of said seed layer, said seed layer being part of said first, second or third silicon layers 6, 8, 10, controls the depth of the amorphous-to-micro-crystalline transition within said first, second and third silicon layers 6, 8 and 10. More precisely, in a preferred embodiment of the invention, said first silicon layer 6 is micro-crystalline: therefore a rather thick seed layer is used (5 to 10-nm-thick) for the deposition of the first silicon layer 6, so as to obtain a rapid transition to the micro-crystalline regime on the amorphous buffer layer 4.

In contrast, the amorphous layer 10a (which is part of said third silicon layer 10) is obtained through the use of a thin seed layer, typically 1-nm-thick. The use of a amorphous layer 10a allows to maintain a good passivation at the interface between said intrinsic buffer layer 4 and the third silicon layer 10, therefore resulting in better efficiency of the final device. As explained before, said second silicon layer 8 and third silicon layer 10 altogether constitute said tunnel layer as described before. Therefore, said tunnel layer is realized by the deposition at the same time of the second silicon layer 8 and the third silicon layer 10, i.e. both layers 8,10 are deposited with the same parameters. Said silicon layer 8, having a thin seed layer as said third silicon layer 10, will be however completely micro-crystalline, because it is grown on top of said first silicon layer 6, which comprises always, to the side away from 2, a microcrystalline layer Overall, the seed layer can have thicknesses ranging from 0 nm (i.e. no seed layer at all) to 10 nm. The total thickness of said first, second and third silicon layers 6, 8 and 10, including the thickness of said seed layer, ranges typically between 0.1 nm and 100 nm.

For the seed layer and the doped layers required for the first, second and third silicon layers 6, 8 and 10, two deposition regimes have been identified. In a first preferred regime called the "high power/high pressure" regime, the PECVD is operated at 13.56 MHz, the pressure is set between 5 and 10 mbar during the layer deposition, and the power density is preferentially close to 0.5 W/cm$^2$. In a second regime called "low power/low pressure", the PECVD is operated at 81.36 MHz, the pressure is set between 1 and 5 mbar, and the power density is preferentially close to 0.1 W/cm$^2$. Note that usually, the same regime is used for the seed layer and the doped layer: e.g., if the "high power/high pressure" regime is used for the seed layer of layer 6, then the same regime will be used for the doped part of layer 6. Combinations of the two regimes within the first, second and third silicon layers 6, 8 and 10 are however possible.

In the "high power/high pressure" regime, the $(H_2+D_2)/SiH_4$ ratio for the seed layer is 450, whereas it is 185 in the "low power/low pressure" regime. These parameters are the same regardless if the seed layer is used in the first silicon layer 6 or in the second and third silicon layers 8 and 10.

For the n-type first silicon layer 6, the $(H_2+D_2)/SiH_4$ and the $(H_2+D_2)/PH_3$ ratios are 133 and 160, respectively, in the "high power/high pressure" regime, whereas it is 185 and 78, respectively, in the "low power/low pressure" regime.

For the p-type second and third silicon layers 8 and 10, the $(H_2+D_2)/SiH_4$ and the $(H_2+D_2)/B(CH_3)_3$ ratios are 266 and 355, respectively, in the "high power/high pressure" regime. Note that the "low power/low pressure" regime is not favorable for the deposition of the doped part of the second and third silicon layers 8 and 10.

The experimental parameters of the explained detailed process steps described above are summarized in the table 2 below.

TABLE 2 experimental parameters of the explained detailed process steps

| | | Layers | | |
|---|---|---|---|---|
| | Parameters | Seed layer used for first, second and third silicon layers 6, 8 and 10 | n-type first silicon layer 6 | p-type second and third layers 8 and 10 |
| High power/ high pressure | Gases | $SiH_4$, $H_2$ ($D_2$) | $SiH_4$, $H_2$ ($D_2$), $PH_3$ | $SiH_4$, $H_2$ ($D_2$), $B(CH_3)_3$ |
| | Frequency | 13.56 MHz | 13.56 MHz | 13.56 MHz |
| | Pressure | 5-15 mbar | 5-15 mbar | 5-15 mbar |
| | Power density | 0.5 W/cm² | 0.5 W/cm² | 0.5 W/cm² |
| | $(H_2 + D_2)/SiH_4$ ratio | 450 | 133 | 266 |
| | $(H_2 + D_2)/PH_3$ ratio | x | 160 | x |
| | $(H_2 + D_2)/B(CH_3)_3$ ratio | x | x | 355 |
| Low power/ low pressure | Gases | $SiH_4$, $H_2$ ($D_2$) | $SiH_4$, $H_2$ ($D_2$), $PH_3$ | x |
| | Frequency | 81.36 MHz | 81.36 MHz | x |
| | Pressure | 1-5 mbar | 1-5 mbar | x |
| | Power density | 0.1 W/cm² | 0.1 W/cm² | x |
| | $(H_2 + D_2)/SiH_4$ ratio | 185 | 185 | x |
| | $(H_2 + D_2)/PH_3$ ratio | x | 78 | x |
| | $(H_2 + D_2)/B(CH_3)_3$ ratio | x | x | x |

Note that the deposition parameters presented above for said preferred embodiment comprising an n-type first silicon layer 6 can also be used to realize the other embodiments of the present invention, provided that the correct doping combinations are used (see [0044]).

Inventive Example

The method of manufacturing and the description of the structural features of the following exemplary tunnel IBC device illustrates the present invention without however limiting the scope.

Description of the Process Flow of an Exemplary Tunnel/BC-SHJ Device According to the Invention:

In order to realize the exemplary photovoltaic device 1 according to the invention, the following steps are performed:

1. A sawn silicon (Si) wafer is provided and a first saw-damage etching step is performed resulting in a smooth wafer surface;
2. An alkaline texturing and chemical cleaning is performed;
3. The Si wafer is then shortly dipped into a 5% hydrofluoric acid solution to allow the oxide etching and is then loaded into a plasma-enhanced chemical vapor deposition (PECVD) tool;
4. At the incident light side, i.e. the front side, of said Si-wafer, a passivating and anti-reflective layer is deposited;
5. A single intrinsic a-Si:H passivation layer is deposited at the back-side which is the side opposite to the incident light on the Si-wafer;
6. A first silicon layer 6 having a first polarity type is plasma-deposited at said back-side;
7. Said first silicon layer 6 is then patterned using any suitable patterning technique;
8. A layer, defined as the tunnel layer, having the opposite polarity to said first silicon layer 6, is then deposited over the full area, covering both the intrinsic buffer layer 4 and said first silicon layer 6;
9. To fabricate the rear electrodes to the side of the wafer opposite to the incident light side, a TCO/metal stack is deposited on said tunnel layer, using physical vapor deposition (PVD) techniques;
10. The deposited TCO/metal stack is then patterned using any suitable technique;
11. Finally, the exemplary photovoltaic device 1 is cured in order to heal potentially present sputter-induced damage of the a-Si:H layers;

Description of the Structural Features of an Exemplary Tunnel/BC-SHJ Device According to the Invention An exemplary realization of the photovoltaic device 1, realized with the above-described process steps has the following structural characteristics:

The Si substrate is of the n-type doping and has a thickness typically between 100 µm and 280 µm;

The front layer 20 at the incident light side consists in a stack of intrinsic and n-type doped a-Si:H layers having each a thickness between 0 nm to 10 nm. Said front layer 20 is capped with a 75-nm-thick $SiN_x$ layer. Even better, a single $SiN_x$ layer which has both passivation and anti-reflective properties may be used; in this case, no a-Si:H layers are deposited at the front side;

The buffer layer is an intrinsic a-Si:H layer 4 having a thickness between 1 nm and 10 nm;

The patterned first silicon layer 6 consists in n-type silicon structures having widths, defined in the plane parallel to the Si substrate, between 0.1 mm and 2.0 mm and having a thickness, defined perpendicular to said Si substrate, between 1 nm and 100 nm; The first silicon layer 6 layer is patterned using an in-situ shadow masking technique; The first silicon layer 6 is deposited using the PECVD parameters given in Table 2;

The interstices 5 between the n-type first type silicon islands have a lateral dimension typically between 0.1 mm to 2.0 mm;

The full-area tunnel layer is a p-type silicon layer having a thickness between 1 nm and 100 nm;

The full-area tunnel layer is amorphous at its interface with the intrinsic buffer layer 4, at least within 1 nm to 5 nm to said interface; The full-area tunnel layer is deposited using the PECVD parameters given in Table 2 for the second and third silicon layers 8 and 10;

The TCO/metal electrode 10 is preferably patterned by a combination of hot-melt inkjet printing and wet-chemical etching.

The typical performances that are obtained with the exemplary device according to the invention are shown in Table 3:

TABLE 3 comparison of performances of an exemplary photovoltaic device according to the invention and the one of the device in EP 1519422 A2; Jsc is the short-circuit current density, Voc the open-circuit voltage and FF is the fill factor.

|  | $J_{sc}$ [mA/cm$^2$] | $V_{oc}$ [mV] | FF [%] | Efficiency [%] |
|---|---|---|---|---|
| Inventive example | 41.5 | 730 | 80 | 24.0 |
| Prior art example | — | 706 | 76.8 | — |

Table 3 shows that, compared to the photovoltaic device of the invention, the device described in EP 1519422 A2 has a 3.2% lower fill factor (FF) and a 30 mV lower open-circuit voltage (Voc).

Figure 5:
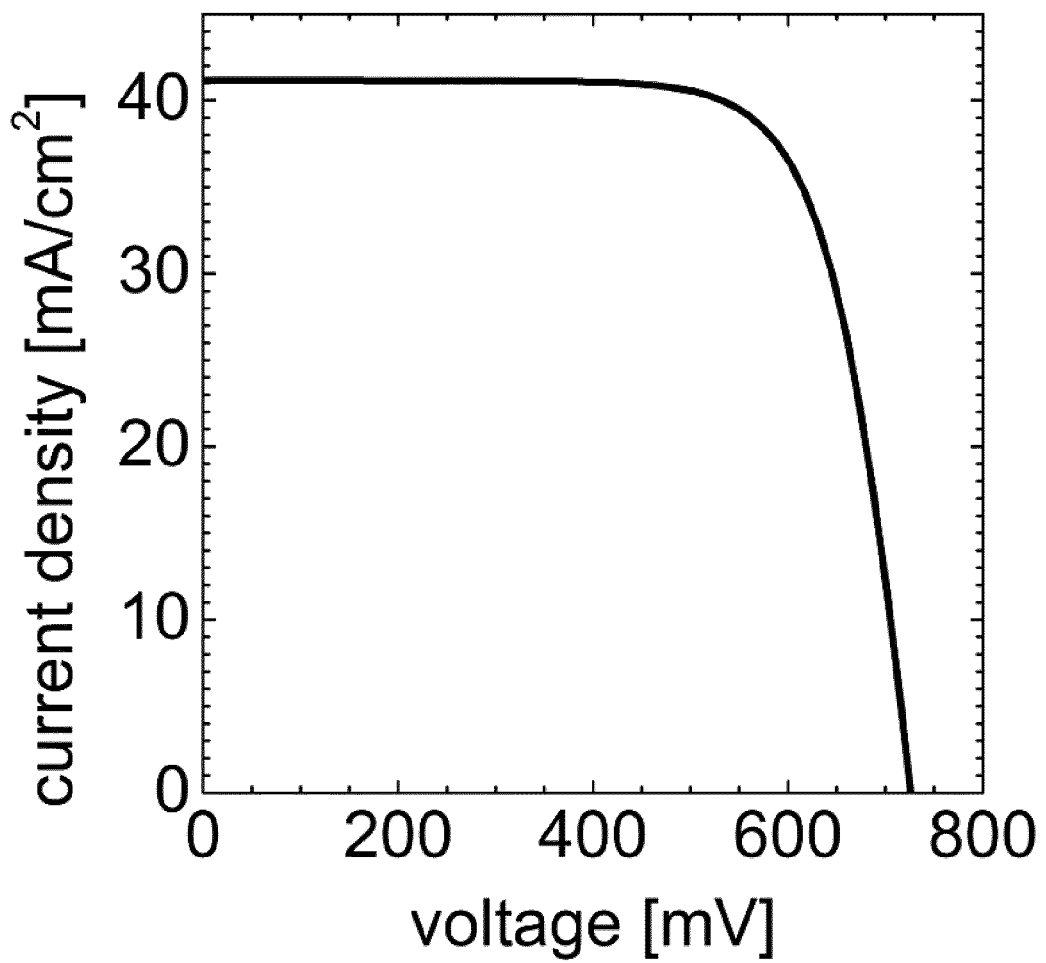
FIG. 5 illustrates the current density in function of the operation voltage of the photovoltaic device of the invention.

In FIG. 5 the relation between the measured current density in function of the operation voltage of the exemplary photovoltaic device 1 of the invention is shown.

The exemplary photovoltaic device 1 illustrates the advantages of the invention, which are twofold:

First, as only one patterning step is required for the PECVD layers, the process results in a simpler, more reliable and more cost-effective solution than those known from the state-of-the-art;

Secondly, the use of μc-Si:H layers at the interface with the TCO/metal electrode yields a reduced contact resistance, hence a higher FF for the final device. At the same time, at the interface with the buffer layer, the p-type tunnel layer is amorphous, which ensures a good passivation, and hence provides an excellent $V_{oc}$ for the final device. This is in contrast with the device described in C, which suffers from FF and Voc losses compared to a photovoltaic device in which each of the two charge collecting types (i.e. n and p) are patterned. This is due to the fact that the tunnel layer used in the device described in EP 1519422 A2 has the same properties when situated on the intrinsic buffer layer 4 and when situated on the patterned, hole—collecting, structures, i.e. said first silicon layer 6.

The invention claimed is:

1. A photovoltaic device comprising:
   a silicon-based substrate having a p-type or n-type doping and having a first face;
   an intrinsic buffer layer situated on said first face;
   a first silicon layer situated on said intrinsic buffer layer, said first silicon layer having a doping of a first type being one of p-type doping or n-type doping, said first silicon layer being a patterned layer situated on predetermined regions of said intrinsic buffer layer and having interstices between said predetermined regions, said first silicon layer comprising an at least partially microcrystalline layer at a side thereof facing away from said silicon-based substrate, said at least partially microcrystalline layer having a Raman crystallinity greater than 5%;
   a second, microcrystalline, silicon layer situated on said first silicon layer, said second silicon layer having a doping of a second type being the other of the p-type doping or the n-type doping with respect to said doping of said first silicon layer and having a Raman crystallinity greater than 5%;
   a third silicon layer situated on said intrinsic buffer layer exclusively at said interstices, said third silicon layer being amorphous with a Raman crystallinity less than 5% at a side thereof facing said silicon-based substrate to a distance of between 1 and 5 nm from said side facing said silicon-based substrate, and having a doping of said second type, said third silicon layer comprising an at least partially microcrystalline layer portion with a Raman crystallinity greater than 5% to the side away from said intrinsic buffer layer; and
   electrically conducting pads situated on said second silicon layer and on said third silicon layer,
   wherein said second silicon layer and the third silicon layer each constitute a tunnel layer, with the doping and the thickness of each tunnel layer being chosen so that the second silicon layer does not impede the charge collecting operation of the photovoltaic device,
   wherein said first silicon layer and said second silicon layer have side edges that are vertically aligned, and wherein said side edges are perpendicular to a light receiving surface of the photovoltaic device.

2. Photovoltaic device according to claim 1, wherein said first silicon layer is entirely microcrystalline with a Raman crystallinity greater than 5%.

3. Photovoltaic device according to claim 1, wherein said first silicon layer is amorphous to a distance of between 1 and 5 nm from a side thereof facing said silicon-based substrate.

4. Photovoltaic device according to claim 1, wherein said third silicon layer is at least partially microcrystalline with a Raman crystallinity of greater than 5% to a distance of between 1 and 5 nm from a side thereof facing away from said silicon-based substrate.

5. Photovoltaic device according to claim 4, wherein said first silicon layer is at least partially microcrystalline with a Raman crystallinity of greater than 5% to a distance of between 1 and 5 nm from a side thereof facing away from said silicon-based substrate.

6. Photovoltaic device according to claim 1, wherein
   said silicon-based substrate is n-type doped and said first type doping is n-type; or
   said silicon-based substrate is n-type doped and said first type doping is p-type; or
   said silicon-based substrate is p-type doped and said first type doping is n-type; or said silicon-based substrate is p-type doped and said first type doping is p-type.

7. Photovoltaic device according to claim 1, wherein said silicon-based substrate is monocrystalline.

8. Photovoltaic device according to claim 1, further comprising a metal oxide layer situated between said electrically-conducting pads and at least one of said second silicon layer and said third silicon layer.

9. A method for manufacturing a photovoltaic device, the method comprising:
   providing a silicon-based substrate having a first face, said silicon-based substrate having a p-type or n-type doping;
   depositing an intrinsic buffer layer on said first face;
   depositing a patterned first silicon layer on predetermined regions of said intrinsic buffer layer thereby leaving interstices between said predefined regions, a first silicon layer having a doping of a first type being one of p-type or n-type, said first silicon layer comprising an at least partially crystalline layer at a side thereof facing away from said silicon-based substrate;
   simultaneously depositing a microcrystalline silicon layer with a Raman crystallinity greater than 5% which forms a second silicon layer on said first silicon layer, and a third silicon layer on said intrinsic buffer layer exclusively at said interstices, said second silicon layer having a doping of a second type being the other of p-type or n-type with respect to the doping of said first silicon layer, said third silicon layer being amorphous with a Raman crystallinity less than 5% at least at a side thereof facing said silicon-based substrate to a distance of between 1 nm and 5 nm from said side facing said silicon-based substrate, and being at least partially microcrystalline with a Raman crystallinity greater than 5% at a side thereof facing away from said silicon-based substrate and having a doping of said second type, said second silicon layer and said third silicon layer each constituting a tunnel layer, with the doping and the thickness of said each tunnel layer being chosen so that the second silicon layer does not impede the charge collecting operation of the photovoltaic device; and
   depositing electrically conducting pads on said second silicon layer and said third silicon layer,
   wherein said first silicon layer and said second silicon layer have side edges that are vertically aligned, and wherein said side edges are perpendicular to a light receiving surface of the photovoltaic device.

10. Method according to claim 9, wherein said second silicon layer is a microcrystalline-type silicon layer with a Raman crystallinity greater than 5%, and said intrinsic buffer layer is amorphous with a Raman crystallinity less than 5%.

11. Method according to claim 10, wherein said first silicon layer is deposited so as to be amorphous with a Raman crystallinity less than 5% to a distance of between 1 and 10 nm from a side thereof facing said silicon-based substrate.

12. Method according to claim 9, wherein said third silicon layer is deposited so as to be at least partially microcrystalline with a Raman crystallinity greater than 5% to a distance of between 1 and 5 nm from a side thereof facing away from said silicon-based substrate.

13. Method according to claim 12, wherein said first silicon layer is deposited so as to be at least partially microcrystalline with a Raman crystallinity greater than 5% to a distance of between 1 and 5 nm from a side thereof facing away from said silicon-based substrate.

14. Method according to claim 9, further comprising, between simultaneously depositing said microcrystalline silicon layer with a Raman crystallinity greater than 5% and depositing said electrically conducting pads,
   depositing a metal oxide layer on at least one of said second silicon layer and said third silicon layer.

15. Photovoltaic device according to claim 1, wherein said second silicon layer has a crystalline portion with a Raman crystallinity between 10% and 80%.

16. Photovoltaic device according to claim 1, wherein said second silicon layer has a crystalline portion with a Raman crystallinity between 20% and 60%.

17. Photovoltaic device according to claim 1, wherein said at least partially microcrystalline layer portion of said third silicon layer has a crystalline portion with a Raman crystallinity between 10% and 80%.

18. Photovoltaic device according to claim 1, wherein said third silicon layer has a crystalline portion with a Raman crystallinity between 20% and 60%.

* * * * *